(12) United States Patent
Cyrusian

(10) Patent No.: US 8,558,610 B2
(45) Date of Patent: Oct. 15, 2013

(54) INTEGRATOR INPUT ERROR CORRECTION CIRCUIT AND CIRCUIT METHOD

(75) Inventor: Sasan Cyrusian, Scotts Valley, CA (US)

(73) Assignee: Marvell World Trade Ltd., St. Michael (BB)

( * ) Notice: Subject to any disclaimer, the term of this patent is extended or adjusted under 35 U.S.C. 154(b) by 34 days.

(21) Appl. No.: 13/313,491

(22) Filed: Dec. 7, 2011

(65) Prior Publication Data

US 2012/0139612 A1    Jun. 7, 2012

Related U.S. Application Data

(60) Provisional application No. 61/420,643, filed on Dec. 7, 2010.

(51) Int. Cl.
*H03F 3/38* (2006.01)
*G06F 7/64* (2006.01)

(52) U.S. Cl.
USPC ............................................. 330/10; 327/336

(58) Field of Classification Search
USPC ........................ 330/10, 251, 207 A
See application file for complete search history.

(56) References Cited

U.S. PATENT DOCUMENTS

| 5,241,220 A | 8/1993 | Karlock |
| 8,081,022 B2 * | 12/2011 | Berkhout et al. ............. 327/172 |
| 2005/0083116 A1 | 4/2005 | Risbo et al. |
| 2008/0088365 A1 | 4/2008 | Jang |

OTHER PUBLICATIONS

International Search Report and Written Opinion from International Application No. PCT/US2011/063712 filed Dec. 7, 2011.

* cited by examiner

*Primary Examiner* — Robert Pascal
*Assistant Examiner* — Khiem Nguyen

(57) ABSTRACT

A circuit includes a first amplifier and a second amplifier, wherein first amplifier is configured to receive an input current at a first input of the first amplifier, and an output of the first op-mp is configured to drive a first input of the second amplifier. The circuit further includes a pull-up current source selectively coupled to the first input of the second amplifier, and a pull-down current source selectively coupled to the first input of the second amplifier. If the absolute value of the input current is larger than a predefined threshold current: i) the pull-up current source is configured to drive current into the first input of the second amplifier for a first polarity of the input current, and ii) the pull-down current source is configured to sink current from the first input of the second amplifier for a second polarity of the input current.

22 Claims, 3 Drawing Sheets

INTEGRATOR INPUT ERROR CORRECTION CIRCUIT AND CIRCUIT METHOD

CROSS REFERENCE TO RELATED APPLICATIONS

This application claims the benefit of, and priority to, U.S. Provisional Patent App. No. 61/420,643, filed Dec. 7, 2010, titled "Integrator Input Error Correction," and is incorporated herein by reference in its entirety for all purposes.

FIELD OF USE

The present application relates to digital amplifiers, and more particularly digital amplifiers having a corrected input voltage at an integrator input.

Unless otherwise indicated in the background, the approaches described in the background section are not prior art to the claims in this application and are not admitted to be prior art by inclusion in the background section.

Audio amplifiers are well known and are used extensively to amplify audio signals. Designing an audio amplifier generally requires balancing two competing concerns. The first concern is fidelity, which relates to the accuracy with which the audio amplifier reproduces the sounds contained in the audio signal. The second concern is power efficiency, which relates to the power consumption of the audio amplifier under various operating conditions.

FIG. 1 is a block diagram of an audio amplifier 100, as known in the prior art. Digital-to-analog converter (DAC) 105 is configured to convert a digital audio signal Dinp to an analog audio signal. The converted analog audio signal is applied to a class AB amplifier 110. The amplified audio signal is applied to load 115 (e.g., a speaker) via an AC coupling capacitor 120. As is well known, audio amplifier 100 has a relatively low efficiency, thus rendering the audio amplifier undesirable for some applications, such as for use in handheld-portable devices, which often have a relatively limited battery life and/or a relatively limited internal cooling capacity.

FIG. 2 is a block diagram of an amplifier 200, such as a class D amplifier. Amplifier 200 may be configured to amplify a set of analog signals (e.g., analog audio signals) for output of the amplified analog signals on a load 210 (i.e., a speaker). More specifically, amplifier 200 may include a signal generator 220 that may be configured to process a received digital signal (Dinp, e.g., a digital audio signal) and output first and second pulse width modulated (PWM) signals 225a and 225b having different pulse widths. Signal generator 220 may be DSP and may include various circuits, such as a sigma-delta circuit with a subsequent pulse width modulator, for processing the received digital audio signal and generating the first and second PWM signals. First PWM signal 225a may be output on a positive output 230a and second PWM signal 225b may be output on a negative output 230b. An output stage 235 of the DSP may be configured to transfer either the first PWM signal 225a onto an output 240 or the second PWM signal 225b onto output 240. Positive and negative signals applied to switches 245a and 245b alternately place the first PWM signal and the second PWM signal onto output 240. A pull-up current source 250a may be coupled to positive output 230a and a pull-down current source 250b may be coupled to negative output 230b. Output 240 may be routed through an input resistor 255 for converting the voltages of the first and second PWM signals to a PWM current signal Ipwm.

Amplifier 200 includes an integrator 260, which may include a number of amplifiers, such as first and second amplifiers 290a and 290b. Integrator 260 is configured to integrate current signals received by integrator 260. The result of the integration is provided to a comparator 265. The output of the comparator is provided to a one shot circuit 270, which controls an output stage 275. A feedback voltage is fed back from the output stage 275 through a feedback resistor 280, which converts the feedback voltage to a feedback current (Ifb). The Ifb is fed back into integrator 260. Integrator 260 is configured to integrate the difference between currents Ipmw and Ifb. Integrator 260 is also configured to integrate the current accumulated by integration capacitor (Cint) 285, which integrates Ipwm. More specifically, the first and the second amplifiers 290a and 290b, and a compensation capacitor (Ccomp) 295 are configured to integrate Ipwm on Cint.

As the output voltage of output stage 275 fluctuates, the Ifb fluctuates and causes Vinp to drift, for example by a few tens of millivolts. The fluctuation in Vinp in an error voltage that is amplified by the integrator and may have a negative effect on the signal processing performed by the integrator. One method for reducing the voltage error associated with Vinp fluctuating is to reduce the capacitance of Ccomp 295, which also increases the bandwidth of the integrator 260. Reducing the capacitance of Ccomp 295 to reduce the voltage error associated with Vinp fluctuating results in a relatively significant amount of additional power consumption by the amplifier.

SUMMARY

According to one embodiment, a circuit includes an integrator configured to receive an input current where the integrator includes a first amplifier and a second amplifier. The first amplifier is configured to receive the input current at a first input of the first amplifier, and an output of the first op-mp is configured to drive a first input of the second amplifier. The circuit further includes a pull-up current source selectively coupled to the first input of the second amplifier, and a pull-down current source selectively coupled to the first input of the second amplifier. If the absolute value of the input current is larger than a predefined threshold current: i) the pull-up current source is configured to drive current into the first input of the second amplifier for a first polarity of the input current, and ii) the pull-down current source is configured to sink current from the first input of the second amplifier for a second polarity of the input current.

According to a specific embodiment, the pull-up current source is configured to be selectively coupled to the first input of the second amplifier via a first control signal if the input current has the first polarity.

According to another specific embodiment, the pull-down current source is configured to be selectively coupled to the first input of the second amplifier via a second control signal if the input current has the second polarity.

According to another specific embodiment, the circuit further includes a first switch coupled between the pull-up current source and the first input. The first switch is configured to be controlled by the first control signal to selectively couple and de-couple the pull-up current source to and from the first input of the second amplifier. The circuit further includes a second switch coupled between the pull-down current source and the first input of the second amplifier. The second switch is configured to be controlled by the second control signal to selectively couple and de-couple the pull-down current source to and from the first input of the second amplifier.

According to another specific embodiment, the circuit further includes a signal generator configured to receive a digital signal and generate the input current, wherein the input current is a pulse width modulated (PWM) current signal having the first polarity or the second polarity and encodes the digital signal, wherein the signal generator is configured to generate the first control signal and the second control signal based on a timing of the PWM current signal.

According to another specific embodiment, the circuit further includes an output stage coupled the integrator and configured to generate an output signal for driving a load based on a set of control signals. The set of control signals includes timing information for controlling a timing of the output signal. The output stage is configured to generate the first control signal and the second control signal for controlling the first switch and the second switch based on a timing of the set of control signals.

According to another specific embodiment, the circuit further includes a feedback path between an output of the output stage and the first input of the first amplifier. The feedback path includes a resistor configured to convert voltages of the output signal to a feedback current. The feedback current causes an input voltage across the first input of the first amplifier and a second input of the first amplifier to a non-zero voltage. The pull-up current source is configured to drive current into the first input of the second amplifier to force the input voltage to zero.

According to another specific embodiment, the pull-down current source is configured to pull current from the first input of the second amplifier to force the input voltage to zero.

According to another specific embodiment, the drive current and the sink current are a function of a compensation capacitance and an integration capacitance of the integrator.

According to another embodiment, a circuit method for a circuit includes receiving an input current at a first amplifier of an integrator configured to integrate the input current, and driving a first input of a second amplifier of the integrator with an output of the first amplifier. The circuit method further includes driving a positive current into the first input if a polarity of the input current is in a first state and if an absolute value of the input current is above a predetermined threshold current. The circuit method further includes pulling a negative current from the first input if a polarity of the input current is in a second state and if the absolute value of the input current is above the predetermined threshold current.

According to a specific embodiment, the circuit method further includes asserting a first control signal from a one-shot circuit to selectively control driving the positive current into the first input.

According to another specific embodiment, the circuit method further includes asserting a second control signal from the one-shot signal to selectively control pulling the negative current from the first input.

According to another specific embodiment, the circuit method further includes asserting the first control signal synchronously with an output of the circuit transitioning to a first output state.

According to another specific embodiment, the circuit method further includes asserting the second control signal synchronously with the output of the circuit transitioning to a second output state, which is different from the first state.

According to another specific embodiment, the circuit method further includes selectively coupling and de-coupling a pull-up current source configured to drive the positive current via the assertion of the first control signal.

According to another specific embodiment, the circuit method further includes selectively coupling and de-coupling a pull-down current source configured to pull the negative current via the assertion of the second control signal.

According to another specific embodiment, the circuit method further includes feeding back a feedback current from an output of the circuit to the first amplifier, and via the driving and the pulling, forcing an input voltage across inputs of the first amplifier to substantially zero volts to correct for a non-zero input voltage introduced across the inputs of the first amplifier via the feedback current.

According to another specific embodiment, the circuit method further includes integrating via the integrator a difference between the feedback current and the input current onto an integration capacitor.

According to another specific embodiment, the positive current and the negative current are proportional to ratio of a compensation capacitance and an integration capacitance of the integrator.

According to another specific embodiment, the circuit method further includes asserting a first control signal from a signal processor to selectively control driving the positive current into the first input.

According to another specific embodiment, the circuit method further includes asserting a second control signal from the signal processor to selectively control pulling the negative current from the first input.

According to another specific embodiment, the first state of the input current and the second state of the input current are opposite states.

The following detailed description and accompanying drawings provide a more detailed understanding of the nature and advantages of the present invention.

DETAILED DESCRIPTION

Embodiments described herein generally provide an amplifier, and more particularly provide an amplifier having a corrected input voltage at an integrator input. Embodiments described herein balance acceptable fidelity with acceptable power consumption, for example, for portable devices, such as mobile phone, personal digital assistants, tablet computers, and the like.

In the following description, for purposes of explanation, numerous examples and specific details are set forth in order to provide a thorough understanding of embodiments of the present invention. Particular embodiments as defined by the claims may include some or all of the features in these examples alone or in combination with other features described below, and may further include modifications and equivalents of the features and concepts described herein.

Figure 1:
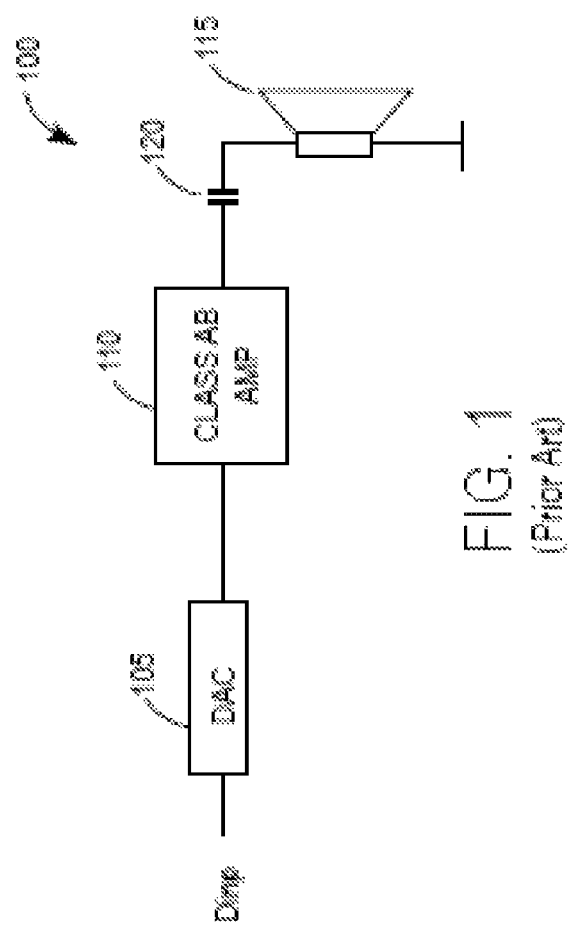
FIG. 1 is a block diagram of an audio amplifier, as known in the prior art.
Figure 2:
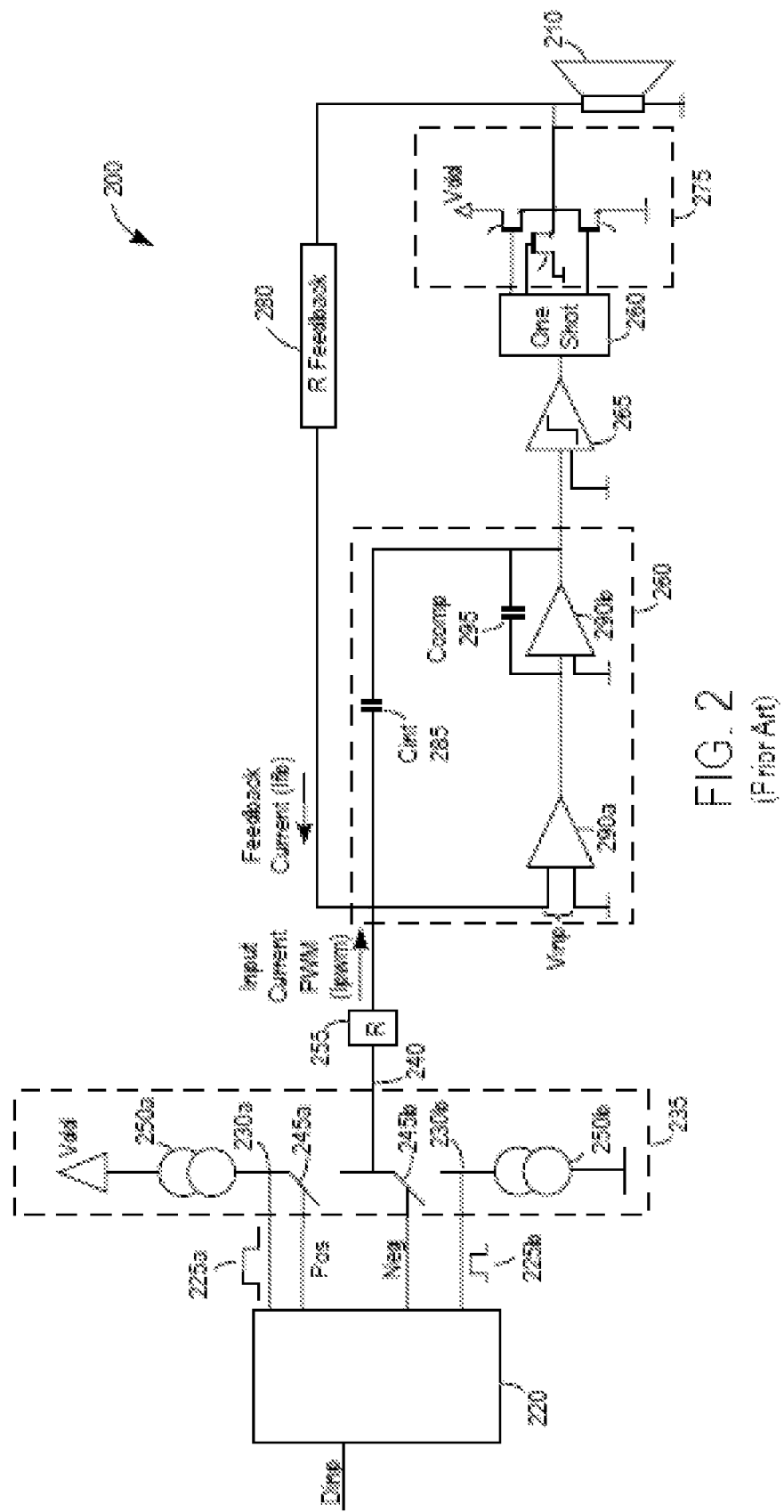
FIG. 2 is a block diagram of an amplifier, such as a class D amplifier.
Figure 3:
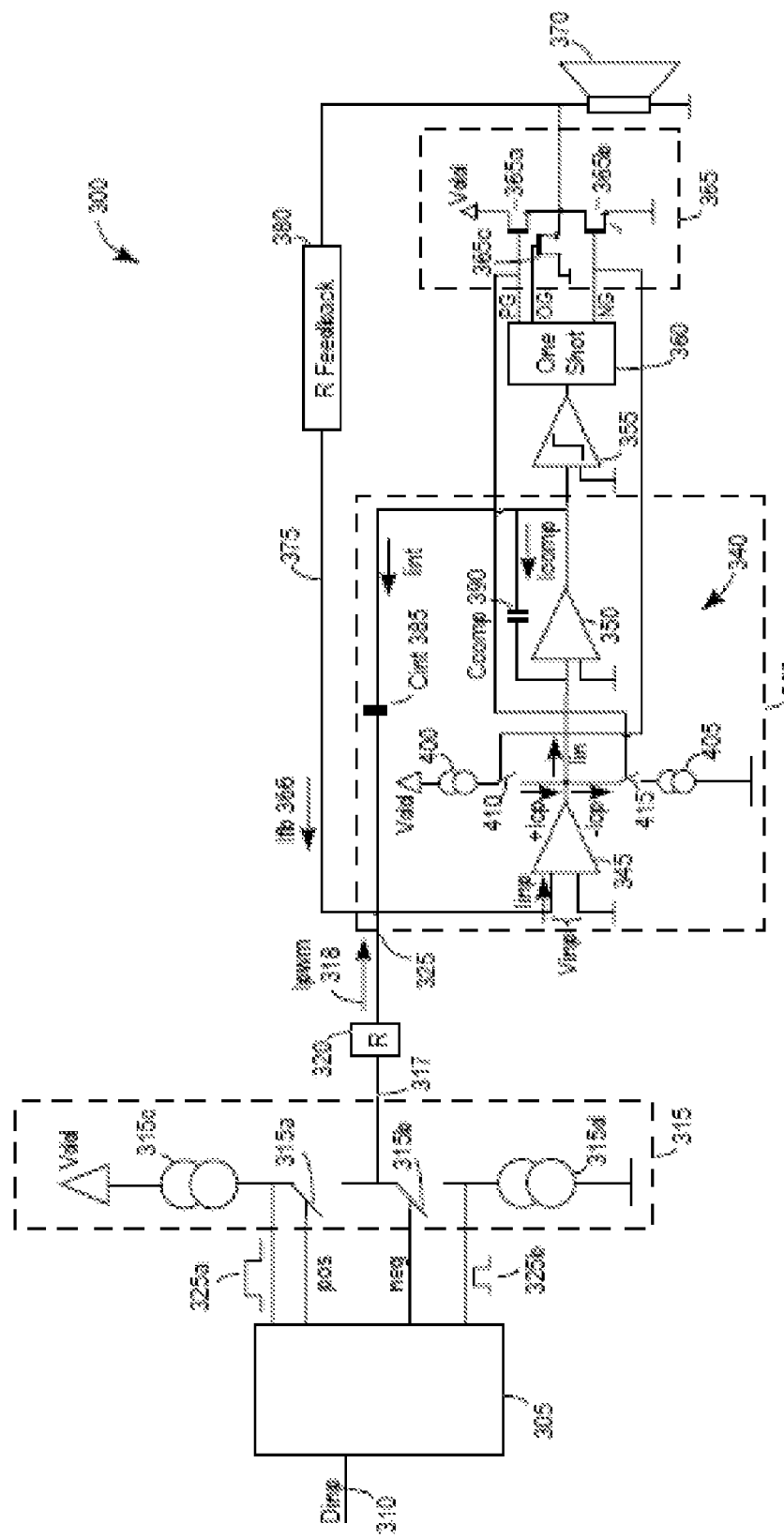
FIG. 3 is a simplified schematic of an amplifier according to one embodiment of the present invention.

FIG. 3 is a simplified schematic of an amplifier 300 according to one embodiment of the present invention. Amplifier 300 may be a Class D amplifier, a digital audio amplifier, or the like. Amplifier 300 includes a signal generator 305, which is configured to receive a digital signal (Dinp) 310. Signal generator 305 may be a digital signal processor and may include a pulse width modulator and a subsequent sigma-delta circuit for processing the received Dinp 310. Signal generator 305 includes an output stage 315 coupled to an input resistor 320. According to some embodiments, input resistor 320 forms a portion of output stage 315 and signal generator 305. Input resistor 320 is coupled between output stage 315 and an input 325 of an integrator 330. Integrator 330 includes a plurality of amplifiers 340. According to a specific embodiment, the plurality of amplifiers 340 includes a first amplifier 345 and a second amplifier 350. A first input of first amplifier 345 is coupled to the input 325 of the integrator 330. First amplifier 345 includes a second input, which may be tied to a reference voltage, such as ground, −Vdd, etc.

An output of first amplifier 345 is coupled to a first input of second amplifier 350. A second input of second amplifier 350 may be tied to a reference voltage, such as ground, −Vdd, etc. An output of second amplifier 350 is coupled to a first input of a comparator 355. Comparator 355 includes a second input, which may be tied to a reference voltage, such as ground, −Vdd. An output of comparator 355 is coupled to an input of a one shot circuit 360. One shot circuit 360 is configured to control an output stage 365 of amplifier 300 where the output stage 365 is configured to transfer amplified signal (e.g., amplified audio signals) to a load 370 (e.g., a speaker). Output stage 365 may include a pull-up transistor 365a, a pull-down transistor 365b, and a tri-state transistor 365c, which are configured to generate a tri-level signal (high, low, and tri-state) based on respective control signals PG, NG, and OG received from the one shot circuit. The PG control signal may be configured to control the pull-up transistor, the OG control signal may be configured to control the tri-state transistor, and the NG signal may be configured to control the pull-down transistor.

According to one embodiment, a feedback circuit path 375 feeds a feedback current from an output of output stage 365 to the first input of the first amplifier 345. Feedback circuit path 375 includes a feedback resistor 380 configured to convert a feedback voltage from output stage 365 to a feedback current 366 (labeled Ifb in FIG. 3).

Integrator 330 further includes an integration capacitor Cint 385, which is coupled between the output of the second amplifier 350 and the first input of the first amplifier 345, and includes a compensation capacitor Ccomp 390, which is coupled between the output of the second amplifier 350 and the first input of the second amplifier 350. The first and the second amplifiers 345 and 350, and compensation capacitor Ccomp 390 are configured to integrate an input current (e.g., Ipwm 318, which is described further below) on integration capacitor Cint.

Integrator 330 further includes a pull-up current source 400 and a pull-down current source 405. A first switch 410 is configured to couple and de-couple the pull-up current source 400 to and from the first input of the second amplifier 350, and a second switch 415 is configured to couple and de-couple the pull-down current source to and from the first input of the second amplifier 350.

As described briefly above, signal generator 305 is configured to receive digital audio signal Dinp 310 and perform processing on Dinp to generate the first and second PWM signals 325a and 325b. Positive (pos as shown in FIG. 3) and negative (neg as shown in FIG. 3) signals are generated by the signal generator and are configured to control whether the first or the second PWM signal is transferred to an output 317 of output stage 315.

Output stage 315 may include switches 315a and 315b, which are controlled by the positive and negative signals applied to switches 315a and 315b alternately place the first PWM signal and the second PWM signal onto output 317. A pull-up current source 315c may be coupled to switch 315a and a pull-down current source 315d may be coupled to switch 315b to alternately couple the pull-up current source and the pull-down current source to output 317.

The voltages of the first and the second PWM signals are converted to a PWM current signal Ipwm 318 by input resistor 320. First amplifier 345 is configured to integrate the difference between Ipwm and Ifb. If Ifb fluctuates, then Vinp across the first and the second inputs of first amplifier 345 may fluctuate, for example, by a few tens of millivolts, which can have a significant negative effect on the signal processing performance of the integrator. According to one embodiment, the pull-up current source 400 and the pull-down current source 405 are configured to source current (+Icp, i.e., positive current compensation) and sink (−Icp, i.e., negative current compensation) current into the first input of second amplifier 350 to force a current Iin at the first input of second amplifier 350 to zero. Forcing Iin at the first input of the second amplifier 350 to zero forces Vinp across the first and the second inputs of the first amplifier to zero and removes the fluctuations of Vinp from Ifb.

According to one embodiment, switch 410 (which couples and decouples pull-up current source 400 to and from the first input of second amplifier 350) is synchronized with the gate of pull-down transistor 365b so that current +Icp is sourced from pull-up current source 400 to the first input of the second amplifier when pull-down transistor 365b is turned on and the output of output stage 365 is pulled low. That is, switch 410 and pull-down transistor 365b are configured to receive the control signal NG from the one-shot circuit at substantially the same time to substantially synchronously close switch 410 and turn on pull-down transistor 365b. The control signal NG is also synchronously de-asserted by the one-shot circuit from switch 410 and pull-down transistor 365b.

Switch 415 (which couples and decouples the pull-up current source to and from the first input of second amplifier 350) is synchronized with the gate of pull-up transistor 365a so that current −Icp is sinked by pull-down current source 400 from the first input of second amplifier 350 when pull-up transistor 365a is turned on and the output node of output stage 365 is pulled high. That is, switch 415 and pull-up transistor 365a are configured to receive the control signal PG from the one-shot circuit at substantially the same time to substantially synchronously close switch 415 and turn on pull-up transistor 365a. Control signal PG is also synchronously de-asserted by the one-shot circuit from switch 415 and pull-up transistor 365a. Providing synchronous operation of switch 410 and pull-up transistor 365a, and synchronous operation of switch 415 and pull-down transistor 365b provides that the current +Icp sourced and −Icp sinked to and from the first input of second amplifier 350 will not introduce additional error into Iin thereby not introducing additional error in Vinp and will reduce Vinp to substantially zero volts to compensate for fluctuations of Vinp introduced by fluctuations of Ifb. That is, by providing synchronous control of switch 415 and pull-up transistor 365a, the temporal current profiles of −Icp and Iin (the current input into the first input of first amplifier 345) are substantially the same, and by providing synchronous control of switch 410 and pull-down transistor 365b, the temporal current profiles of +Icp and Iin are substantially the same. According to one embodiment, the timing of the control signals PG, OG, and NG may be based on the timing of the positive and the negative signals generated by signal generator 305 for controlling switches 410 and 415, for example, if Ipwm is positive or negative and if the absolute value of Ipwm is greater than a predetermined threshold current, which may be set by the reference voltage applied to the second input of the first amplifier 345. That is, the timing of the positive and the negative signals generated by signal generator 305 may control the timing of the PG and the NG signals to control the switching of switches 410 and 415. Alternatively, the positive and the negative signals from signal generator 305 may be configured to control switches 410 and 415 as described above.

The amount of current +Icp sourced or −Icp sinked at the first input of the second amplifier 350 to force Vinp to zero forces Iin to zero at the first input of the second amplifier. The amount of current +Icp sourced or −Icp sinked at the first input of the second amplifier 350 to force Vinp to zero and force Iin to zero is a function of the capacitances of integration capacitor Cint 385 and compensation capacitor Ccomp 390. For Vinp to be zero, +Icp=(Ccomp/Cint)×(−Iint) and −Icp=(Ccomp/Cint)×Iint where Iint is the integration current supplied to Cint by the output of the second amplifier. As described above, controlling the magnitude and temporal assertion of +Icp and −Icp at the first input of second amplifier 350 provides that Vinp is zero and provides that +Icp and −Icp do not introduce additional error in Vinp.

According to one embodiment, subsequent to current +/−Icp being sourced or sinked at the first input of the second amplifier 350, the second amplifier amplifies the first and second PWM signals, which were previously amplified by the first amplifier with Vinp corrected to zero volts. After amplification of the first and second PWM signals by the first and second amplifiers the amplified PWM signals are applied to the first input of comparator 355. The second input of the comparator is tied to a reference voltage Vref, which may be ground. If a voltage level of the amplified PWM signals applied to comparator 355 is greater than the reference voltage Vref, the output signal of comparator 355 is set to a high level, and if the voltage of the amplified PWM signals are less than the reference voltage Vref, the output signal of comparator 355 is set to a low level, which is less than the high level. Comparator 355 may be powered by supply voltage Vdd and −Vdd.

One shot circuit 360 is configured to receive the high level and the low level signals output by comparator 355 and may receive additional signals, such as timing signals for controlling the timing of asserting control signals PG, OG, and NG to output stage 365. As discussed briefly above, output stage 365 is configured to generate a tri-level signal based on the assertion of control signals PG, OG, and NG respectively on pull-up transistor 365a, tri-state transistor 365c, and pull-down transistor 365b. According to one embodiment, the output of output stage 365 is filtered by a filter to remove high frequencies from the output signal of output stage 365. Amplifier 300 may include a low-pass filter, a band-pass filter, or other filter configured to perform the described filtering. According to one embodiment, the load 370 (e.g., a speaker) includes the described filter and the output of output stage 365 may be applied directly to the load.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations, and equivalents may be employed without departing from the scope of the invention as defined by the claims.

What is claimed is:

1. A circuit comprising:
   an integrator configured to receive an input current, wherein the integrator includes:
     a first amplifier and a second amplifier, wherein first amplifier is configured to receive the input current at a first input of the first amplifier, and an output of the first amplifier is configured to drive a first input of the second amplifier;
     a pull-up current source selectively coupled to the first input of the second amplifier; and
     a pull-down current source selectively coupled to the first input of the second amplifier; wherein if the absolute value of the input current is larger than a predefined threshold current:
       the pull-up current source is configured to drive current into the first input of the second amplifier for a first polarity of the input current, and
       the pull-down current source is configured to sink current from the first input of the second amplifier for a second polarity of the input current.

2. The circuit of claim 1, wherein the pull-up current source is configured to be selectively coupled to the first input of the second amplifier via a first control signal if the input current has the first polarity.

3. The circuit of claim 1, wherein the pull-down current source is configured to be selectively coupled to the first input of the second amplifier via a second control signal if the input current has the second polarity.

4. The circuit of claim 1, further comprising:
   a first switch coupled between the pull-up current source and the first input, wherein the first switch is configured to be controlled by a first control signal to selectively couple and de-couple the pull-up current source to and from the first input of the second amplifier; and
   a second switch coupled between the pull-down current source and the first input of the second amplifier, wherein the second switch is configured to be controlled by a second control signal to selectively couple and de-couple the pull-down current source to and from the first input of the second amplifier.

5. The circuit of claim 4, further comprising a signal generator configured to receive a digital signal and generate the input current, wherein the input current is a pulse width modulated (PWM) current signal having the first polarity or the second polarity and encodes the digital signal, wherein the signal generator is configured to generate the first control signal and the second control signal based on a timing of the PWM current signal.

6. The circuit of claim 4, further comprising an output stage coupled the integrator and configured to generate an output signal for driving a load based on a set of control signals, wherein the set of control signals includes timing information for controlling a timing of the output signal, and wherein the output stage is configured to generate the first control signal and the second control signal for controlling the first switch and the second switch based on a timing of the set of control signals.

7. The circuit of claim 6, further comprising a feedback path between an output of the output stage and the first input of the first amplifier, wherein:
   the feedback path includes a resistor configured to convert voltages of the output signal to a feedback current, wherein the feedback current causes an input voltage across the first input of the first amplifier and a second input of the first amplifier to a non-zero voltage, and
   the pull-up current source is configured to drive current into the first input of the second amplifier to force the input voltage to zero.

8. The circuit of claim 7, wherein the pull-down current source is configured to pull current from the first input of the second amplifier to force the input voltage to zero.

9. The circuit of claim 1, wherein the drive current and the sink current are a function of a compensation capacitance and an integration capacitance of the integrator.

10. A circuit method of operating a circuit comprising:
receiving an input current at a first amplifier of an integrator configured to integrate the input current;
driving a first input of a second amplifier of the integrator with an output of the first amplifier;
driving a positive current into the first input if a polarity of the input current is in a first state and if an absolute value of the input current is above a predetermined threshold current; and
pulling a negative current from the first input if a polarity of the input current is in a second state and if the absolute value of the input current is above the predetermined threshold current.

11. The circuit method of claim 10, further comprising asserting a first control signal from a one-shot circuit to selectively control driving the positive current into the first input.

12. The circuit method of claim 11, further comprising asserting a second control signal from the one-shot circuit to selectively control pulling the negative current from the first input.

13. The circuit method of claim 12, further comprising asserting the first control signal synchronously with an output of the circuit transitioning to a first output state.

14. The circuit method of claim 13, further comprising asserting the second control signal synchronously with the output of the circuit transitioning to a second output state, which is different from the first state.

15. The circuit method of claim 13, selectively coupling and de-coupling a pull-up current source configured to drive the positive current via the assertion of the first control signal.

16. The circuit method of claim 13, selectively coupling and de-coupling a pull-down current source configured to pull the negative current via the assertion of the second control signal.

17. The circuit method of claim 10, further comprising:
feeding back a feedback current from an output of the circuit to the first amplifier; and
via the driving and the pulling, forcing an input voltage across inputs of the first amplifier to substantially zero volts to correct for a non-zero input voltage introduced across the inputs of the first amplifier via the feedback current.

18. The circuit method of claim 17, further comprising integrating via the integrator a difference between the feedback current and the input current onto an integration capacitor.

19. The circuit method of claim 10, wherein the positive current and the negative current are proportional to ratio of a compensation capacitance and an integration capacitance of the integrator.

20. The circuit method of claim 10, further comprising asserting a first control signal from a signal processor to selectively control driving the positive current into the first input.

21. The circuit method of claim 10, further comprising asserting a second control signal from a signal processor to selectively control pulling the negative current from the first input.

22. The circuit method of claim 10, wherein the first state of the input current and the second state of the input current are opposite states.

* * * * *